(12) United States Patent
Yu et al.

(10) Patent No.: US 7,851,377 B2
(45) Date of Patent: Dec. 14, 2010

(54) CHEMICAL VAPOR DEPOSITION PROCESS

(75) Inventors: Chen-Hua Yu, Hsin-Chu (TW);
Liang-Gi Yao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 608 days.

(21) Appl. No.: 11/652,209

(22) Filed: Jan. 11, 2007

(65) Prior Publication Data

US 2008/0171445 A1    Jul. 17, 2008

(51) Int. Cl.
*H01L 21/31* (2006.01)

(52) U.S. Cl. .................... 438/761; 438/758

(58) Field of Classification Search .......... 427/562, 427/576, 586; 118/723 R–723 ME; 438/758, 438/761
See application file for complete search history.

(56) References Cited

U.S. PATENT DOCUMENTS

| | | | |
|---|---|---|---|
| 5,965,219 A * | 10/1999 | Hayashi et al. ......... 427/586 |
| 6,787,482 B2 | 9/2004 | Thakur et al. |
| 6,838,125 B2 * | 1/2005 | Chung et al. ............ 427/562 |
| 7,470,454 B2 * | 12/2008 | Lukas et al. ............ 427/509 |
| 2002/0035962 A1 * | 3/2002 | Sakuma ................ 118/50.1 |
| 2004/0083951 A1 * | 5/2004 | Sandhu ................... 118/58 |
| 2005/0145177 A1 * | 7/2005 | McSwiney et al. ... 118/723 MA |
| 2006/0288937 A1 * | 12/2006 | Dando et al. ........... 118/722 |

OTHER PUBLICATIONS

Gutsche, M. et al., "Atomic Layer Deposition for Advanced DRAM Applications," Jul. 11, 2003. Future Fab Intl. vol. 15, 8 pages, www.future-fab.com/documents.asp?grlD=214&d_ID=1900, downloaded Jan. 11, 2007.

* cited by examiner

*Primary Examiner*—Douglas M Menz
(74) *Attorney, Agent, or Firm*—Slater & Matsil, L.L.P.

(57) ABSTRACT

A chemical vapor deposition (CVD) method includes placing a semiconductor wafer into a reaction chamber; introducing a precursor into the reaction chamber; activating the precursor to a high-energy state using a non-direct plasma energy source; and reacting the precursor to form a film on the semiconductor wafer.

7 Claims, 5 Drawing Sheets

CHEMICAL VAPOR DEPOSITION PROCESS

TECHNICAL FIELD

This invention relates generally to integrated circuit manufacturing processes, and more particularly to chemical vapor deposition processes.

BACKGROUND

Chemical vapor deposition (CVD) is widely used in the semiconductor industry for manufacturing integrated circuits. There are a variety of CVD methods, such as atomic layer deposition (ALD), metal organic CVD (MOCVD), plasma enhanced CVD (PECVD), and the like. Although these methods may be based on different mechanisms, they all utilize chemical reactions, wherein gaseous reactants are introduced into reaction chambers, in which the chemical reaction occurs and products of the chemical reactions are deposited.

With the increasing down-scaling of integrated circuits, devices are becoming increasingly smaller, and accordingly, the components are decreasing in size in each of the devices. For example, the thicknesses of gate dielectrics of transistors will be scaled down by about two angstroms in next generation. Currently, the thickness of conventional $SiO_2$ gate dielectrics is close to its theoretic limit. Dielectric materials with high dielectric constants (high-k) are thus used to replace $SiO_2$.

High-k dielectric materials, such as $HfSiO_x$ and $HfO_2$, are often formed using ALD. As opposed to most of the other CVD methods, which are characterized by continuous deposition and concurrent flow of precursors, ALD is based on the sequential growth of individual mono-layers or fractions of a mono-layer in a well-controlled manner. In ALD, the growth surface is alternately exposed to only one of several chemicals. For example, individual precursors are supplied to the reaction chamber one at a time. The exposure steps are separated by inert gas purge steps in order to remove any residual chemically active source gas or by-products before another precursor is introduced into the reactor. Thus, ALD consists of repetitions of individual growth cycles. During each exposure step, precursor molecules react with the surface of the wafer in the reaction chamber until all available surface terminals are reacted. Precursor chemistries and process conditions are chosen such that no further reaction takes place once reactions on the surface are completely saturated. Surface saturation guarantees the self-limiting nature of ALD. Precursors are preferably overdosed so that the reactions are independent of potential variations in the amount of precursors supplied to the surface. Thus, surface chemistry, rather than a precise control of tool specific process parameters such as precursor flow and partial pressure, governs the film growth. A known and constant thickness is deposited per growth cycle.

ALD has the ability of forming high-quality films, and is particularly useful for forming thin films. However, when the physical thicknesses of gate dielectric layers reach about 20 Å or less, the leakage of gate dielectric layers becomes a great concern, and thus the quality of gate dielectric layers requires further improvement. Conventionally, ALD has a relatively long incubation time, potentially causing the film quality to be adversely affected. In addition, due to the low temperature of ALD, incomplete reactions may occur, which also affects the quality of films. Accordingly, new methods are needed to further improve the quality of the films.

SUMMARY OF THE INVENTION

In accordance with one aspect of the present invention, a chemical vapor deposition (CVD) method includes placing a semiconductor wafer into a reaction chamber; introducing a precursor into the reaction chamber; activating the precursor by using a non-direct plasma energy source; and reacting the precursor to form a film on the semiconductor wafer.

In accordance with another aspect of the present invention, an atomic layer deposition (ALD) method includes placing a semiconductor wafer into a reaction chamber; pulsing a reactant into the reaction chamber; applying a light on the reactant; reacting the reactant to form a film on the semiconductor wafer; and performing a purging step to the reaction chamber.

The advantageous features of the present invention include improved film quality and reduced incubation time.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following discussion, the formation of $HfSiO_x/HfO_2$ film using atomic layer deposition (ALD) is used as an example to explain the concept of the present invention. One skilled in the art will realize, however, that the concept of the present invention may be applied for the deposition of other materials using other chemical vapor deposition (CVD) methods.

Figure 1:
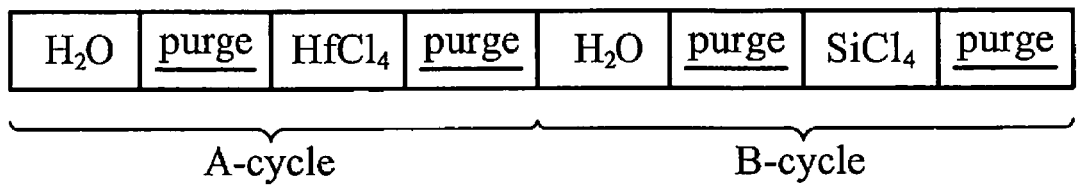
FIG. 1 illustrates an exemplary pulse and purge sequence for forming $HfSiO_x/HfO_2$ films, wherein the sequence includes A-cycles and B-cycles, each for pulsing a chemical.

In a typical ALD process, many deposition cycles are performed. In each of the cycles, chemical reactions occur, and a thin layer is deposited. FIG. 1 illustrates exemplary cycles for forming an $HfSiO_x/HfO_2$ film, wherein the notation of $HfSiO_x/HfO_2$ indicates the resulting film includes $HfSiO_x$, $HfO_2$, or combinations thereof. First, water ($H_2O$) is pulsed into an ALD reaction chamber, followed by a purge step to remove excess $H_2O$ and by-products. The purge may be performed using nitrogen or an inert gas, such as helium, argon, krypton, and the like. A precursor gas comprising hafnium tetrachloride ($HfCl_4$) is then pulsed into the ALD reaction chamber, followed by another purge step. For simplicity purposes, the cycle including a water pulse, a purge step, a HfCl₄ pulse and another purge step are referred to as an A-cycle. FIG. 1 further illustrates a B-cycle, which includes a water pulse, a purge step, a silicon tetrachloride (SiCl₄) pulse and another purge step.

Figure 2:
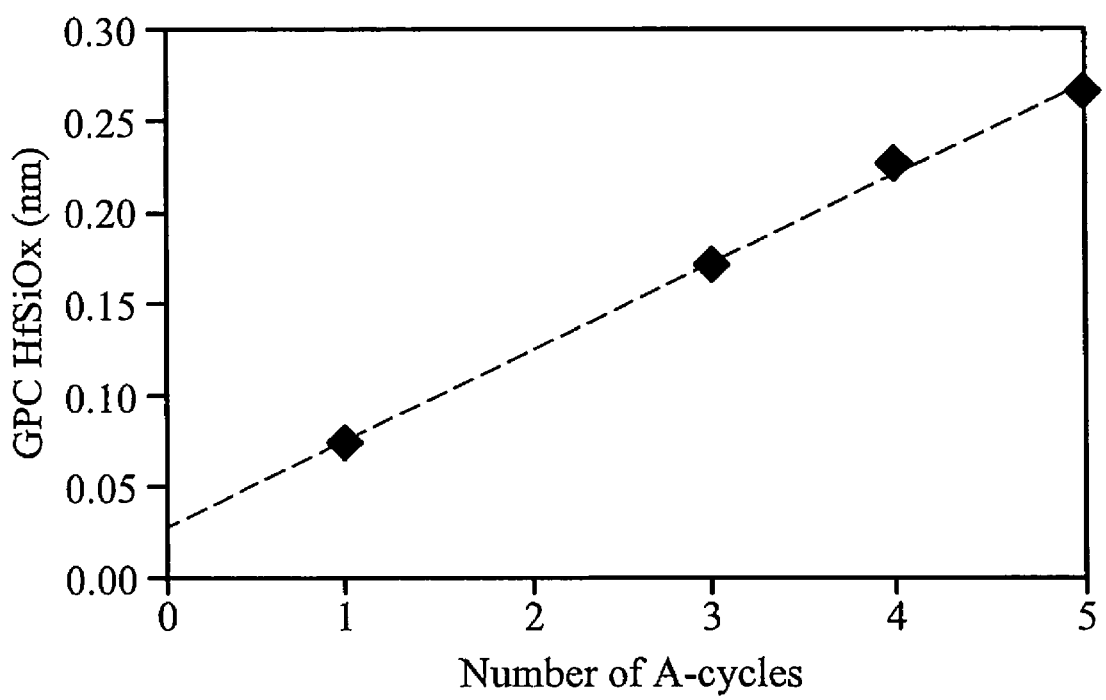
FIG. 2 illustrates growth-per-cycle of $HfSiO_x/HfO_2$ film as a function of a number of A-cycles.

An ALD process for forming an HfSiO$_x$ and/or HfO₂ film may include a combination of A-cycles and B-cycles. A ratio of the number of A-cycles to the number of B-cycles affects the composition of the deposited film. If more A-cycles are performed, a ratio of HfO₂ to HfSiO$_x$ in the resulting film increases. Conversely, more B-cycles may result in a smaller ratio of HfO₂ to HfSiO$_x$. FIG. 2 illustrates experiment results showing the thickness of deposited HfSiO$_x$/HfO₂ as a function of the number of A-cycles. In the experiment, each B-cycle is followed (and also preceded) by five A-cycles. The Y-axis shows the growth-per-cycle (GPC) of the HfSiO$_x$/HfO₂ film. It is noted that for each additional A-cycle, the thickness of HfSiO$_x$/HfO₂ film increases, and the growth is close to linear with respect to the number of A-cycles.

Figure 3:
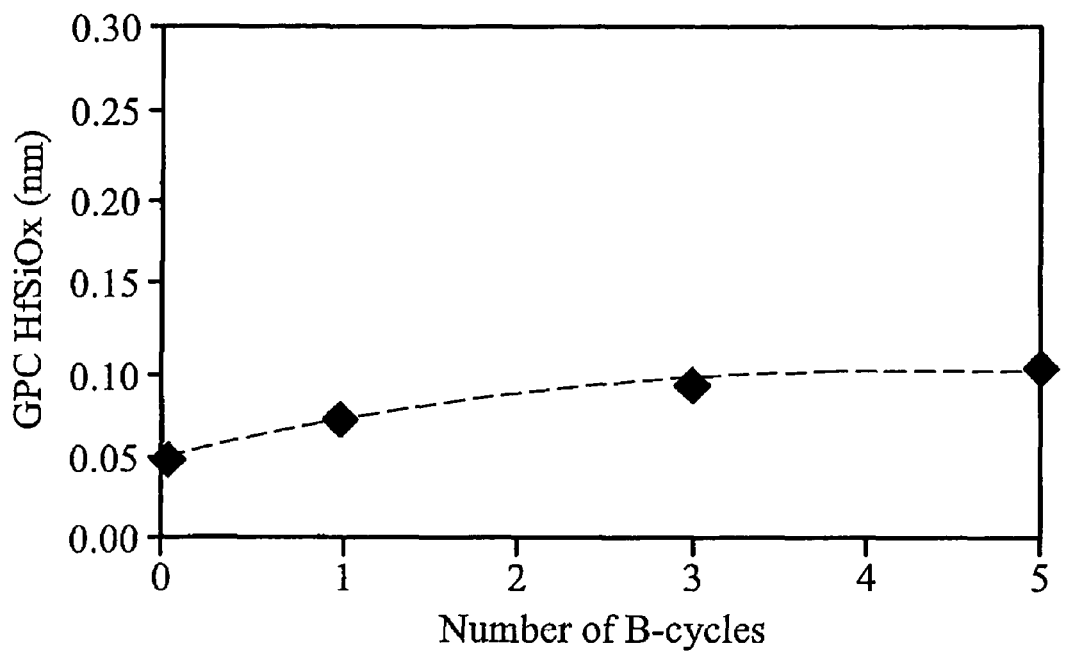
FIG. 3 illustrates growth-per-cycle of $HfSiO_x/HfO_2$ film as a function of a number of B-cycles.

FIG. 3 illustrates experiment results showing the thickness of deposited HfSiO$_x$/HfO₂ as a function of the number of B-cycles. In the experiment, each A-cycle is followed (and also preceded) by five B-cycles. The Y-axis shows the growth-per-cycle (GPC) of the HfSiO$_x$/HfO₂ film. It is noted that with each B-cycle, the thickness of the HfSiO$_x$/HfO₂ film still increases. However, the growth is not linear, and the GPC is increasingly reduced after each B-cycle. It appears that the GPC is close to saturated after the first B-cycle.

One of the possible reasons of the phenomenon shown in FIGS. 2 and 3 is explained as follows. In an A-cycle, HfCl₄ reacts with H₂O, and an exemplary reaction may be expressed as:

[Eq. 1]

wherein HCl is purged from the reaction chamber in the subsequent purge step, and Hf—OH remains on the surface of the wafer. The efficiency for converting HfCl₃ into Hf—OH bonds depends on the energy state of HfCl₄ precursor.

During the subsequent B-cycles, SiCl₄ reacts with Hf—OH, which may cause the formation of either Hf—Si—OH bond or Hf—O—Si—OH bond later. However, SiCl₄ only reacts with Hf—OH, but not with Si—OH. In the first B-cycle following the A-cycle, the Hf—OH formed during the A-cycle is substantially exhausted, and hence the reaction of SiCl₄ with Hf—OH is close to saturation. Therefore, the newly introduced SiCl₄ will not continue to react with the chemicals and products in the ALD reaction chamber. Even if more B-cycles are performed, since there is not enough Hf—OH produced, the reaction is slow. Accordingly, in FIG. 3, the GPC is increasingly reduced with respect to the number of B-cycles.

HfCl₄, on the other hand, can react with both Si—OH and Hf—OH. In each of the A-cycles, the newly introduced HfCl₄ may react with water, or Hf—OH generated in the previous cycle, and thus there are enough new reactions to continue the growth of the film.

Figure 4:
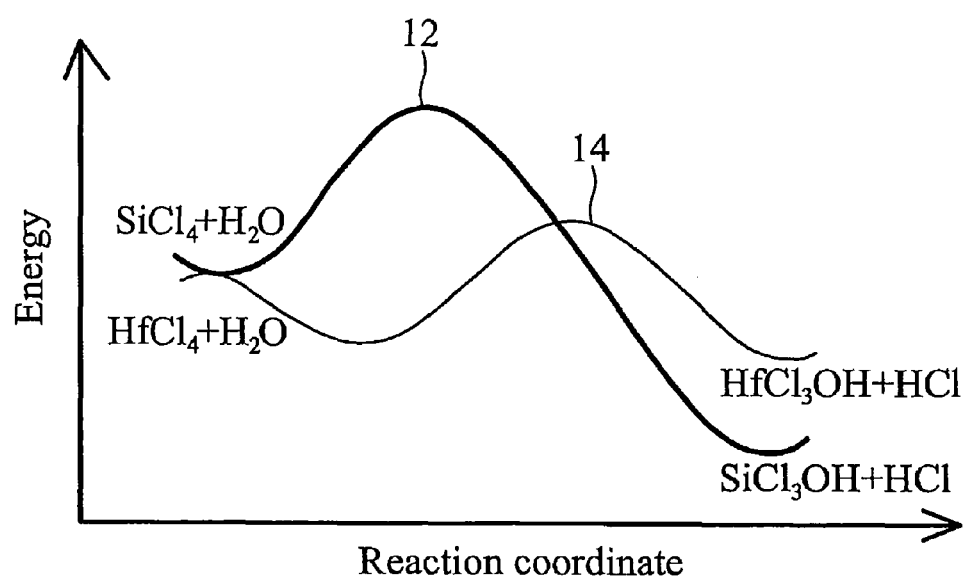
FIG. 4 schematically illustrates free energy barriers for chemical reactions.

The different behaviors of HfCl₄ and SiCl₄ may be explained using FIG. 4. The Y-axis represents the energy level, while the X-axis represents the action coordinate. The left side of the X-axis illustrates exemplary reactants, while the right side of the X-axis illustrates corresponding products. FIG. 4 illustrates that free energy barriers 12 and 14 must be overcome during reaction for final product, wherein the magnitude of the free energy barriers are affected by surface energies and the energies for breaking bonds of the reactants. In the reactions discussed in the preceding paragraphs, the reaction of HfCl₄ with water or OH bonds is relatively fast, while the reaction of SiCl₄ with water is relatively slow. Therefore, the energy barrier is higher for SiCl₄ to react with water, and thus leads to less intermediate products. Once the reaction with Hf-containing products has occurred, less reaction bonding having low energy barriers are available. This causes the difficulty and slow reaction of B-cycles.

Figure 5:
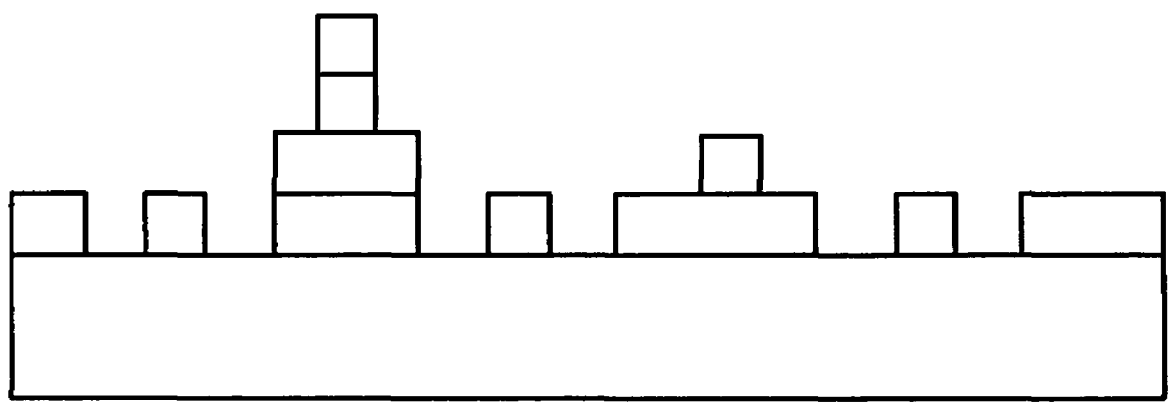
FIG. 5 schematically illustrates molecules/atoms non-uniformly deposited on a surface of a substrate.

The high free energy barriers cause two consequences. First, the incubation takes a long time to finish, which causes an increase in the roughness of the resulting film. FIG. 5 schematically illustrates molecules/atoms deposited on substrate 18, wherein blocks are used to symbolize molecules/atoms. It is noted that the surface of deposited molecules/atoms is rough, with no molecules/atoms in some regions, while more than one layer is deposited on other regions. In very thin films such as gate dielectrics, the roughness results in high leakage current. Second, higher free energy barriers lead to incomplete reactions. In the above-mentioned example, substantial Si—Cl bonds are left in the final gate dielectric layer due to a higher energy barrier for Si—Cl to bond with water. The gate dielectric layer is thus less dense. As a result, high leakage currents and low breakdown voltages were found in transistors with these kinds of gate dielectrics.

Based on the above experiment results and perception, the preferred embodiments of the present invention are provided. To overcome high free energy barriers, an energy source is provided to activate ALD reactants to higher energy states for promoting chemical reactions. In the exemplary embodiment discussed in the preceding paragraphs, the reactants include water and precursors such as SiCl₄ and HfCl₄. Throughout the description, the term "precursor" is used to refer to all reactants for the ALD processes, including water.

The preferred energy source preferably provides sufficient activation energy to the precursors for overcoming the reaction energy barrier. The energy source may be ultra-violet (UV) light, laser, remote plasma, and the like. In the preferred embodiment, the energy source is UV light. The preferred wavelength of the UV light is related to the type of precursors and the energy needed for activating the precursors to the desired states. The optimum wavelength may be determined through experiments. As commonly known in the art, the energy provided by the UV light is E=(hC)/λ, wherein E is the energy, h is Planck's constant, C is the speed of light, and λ is the wavelength of the UV light. Therefore, the shorter the wavelength λ, the higher energy is provided by the UV light. In an exemplary embodiment, the wavelength λ of the UV light is between about 120 nm and about 400 nm.

The activation energy can be provided in different ways to optimize the ALD process. In an embodiment, all precursors are activated. In other embodiments, only some of the precursors are activated. For example, only those precursors (and the respective reactions) having high free energy barriers (such as SiCl₄) are activated, while other precursors (such as HfCl₄) are not activated. In yet other embodiments, the treatment may be performed to every cycle, or only to a selected percentage of the cycles. The activation of the precursors may further be used as a means for adjusting the composition of the resulting film. Using the deposition of HfSiO$_x$ as an example, if a higher ratio of HfO₂ to HfSiO$_x$ is preferred, the percentage of the activated SiCl₄ cycles is reduced, so that less silicon is incorporated into the resulting film. Conversely, if a lower ratio of HfO₂ to HfSiO$_x$ is preferred, the percentage of the activated SiCl₄ cycles is increased, so that more silicon is incorporated into the resulting film.

The energy source may be applied for longer or shorter amount of time. In one embodiment, the activation is performed during the entire duration of the ALD process. In other embodiments, the UV treatment is performed only during the period of precursor pulses, but not during the purge processes.

Figure 6A:
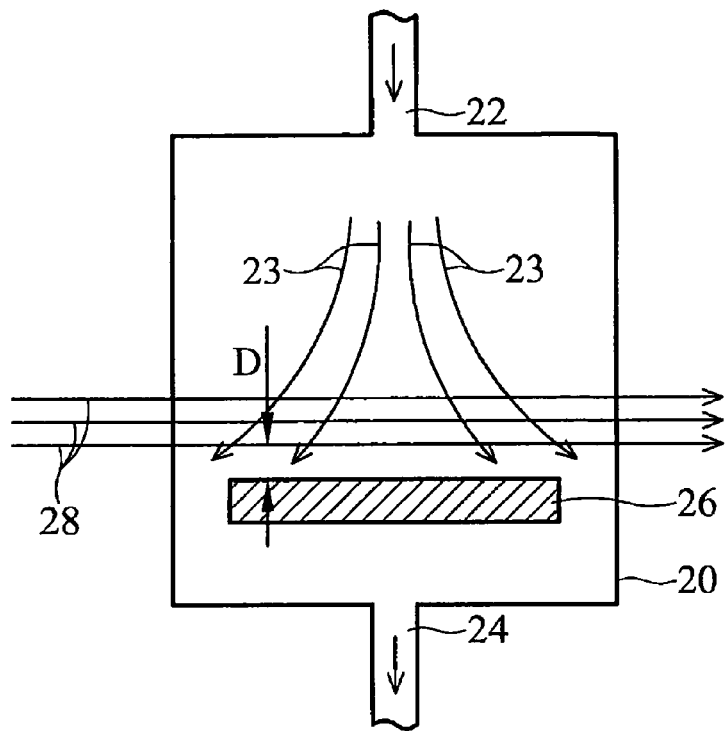
FIGS. 6A through 7 illustrate embodiments for activating reactants.
Figure 6B:
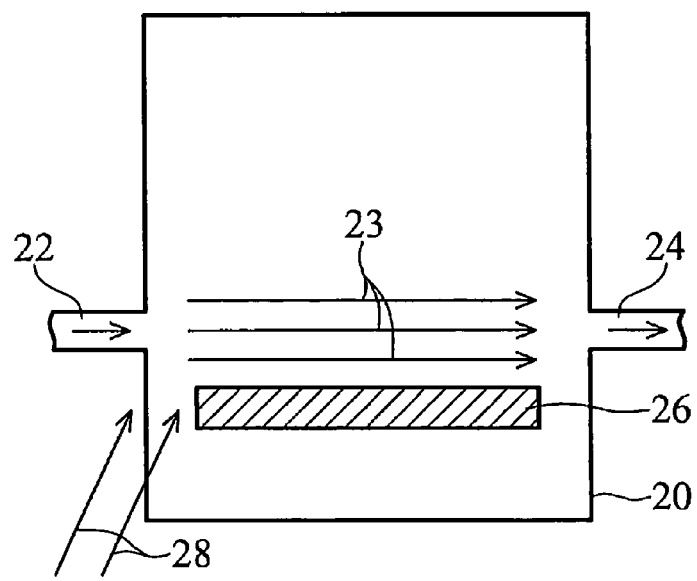

Since high-energy states are unstable, and the precursors at higher-energy states will quickly decay and return to low-energy states, it is preferred that the activation is performed at a location immediately before the precursors reach a semiconductor wafer, on which a film is to be deposited. Therefore, the activation is preferably in-situ performed in the ALD reaction chamber in most cases. In some other cases, the activation could be applied after precursor purges. FIG. 6A schematically illustrates an embodiment for activating reactants in an in-situ way. Wafer 26 is placed in an ALD reaction chamber 20, which has reactant inlet 22 and outlet 24. The reactants 23 flow in the direction from inlet 22 to outlet 24. The energy source, for example, the UV light, which is symbolized by arrows 28, is applied above wafer 26, and distance D between the UV light and wafer 26 is preferably as small as possible. Therefore, a thin region immediately over wafer 26 is preferably free from the UV light. The activated precursors reach wafer 26 almost immediately after the activation. The UV light preferably covers the entire path of the reactants. FIG. 6B illustrates another embodiment, wherein reactants 23 flows in a direction parallel to the surface of wafer 26, and the UV light is applied on reactants 23.

Figure 7:
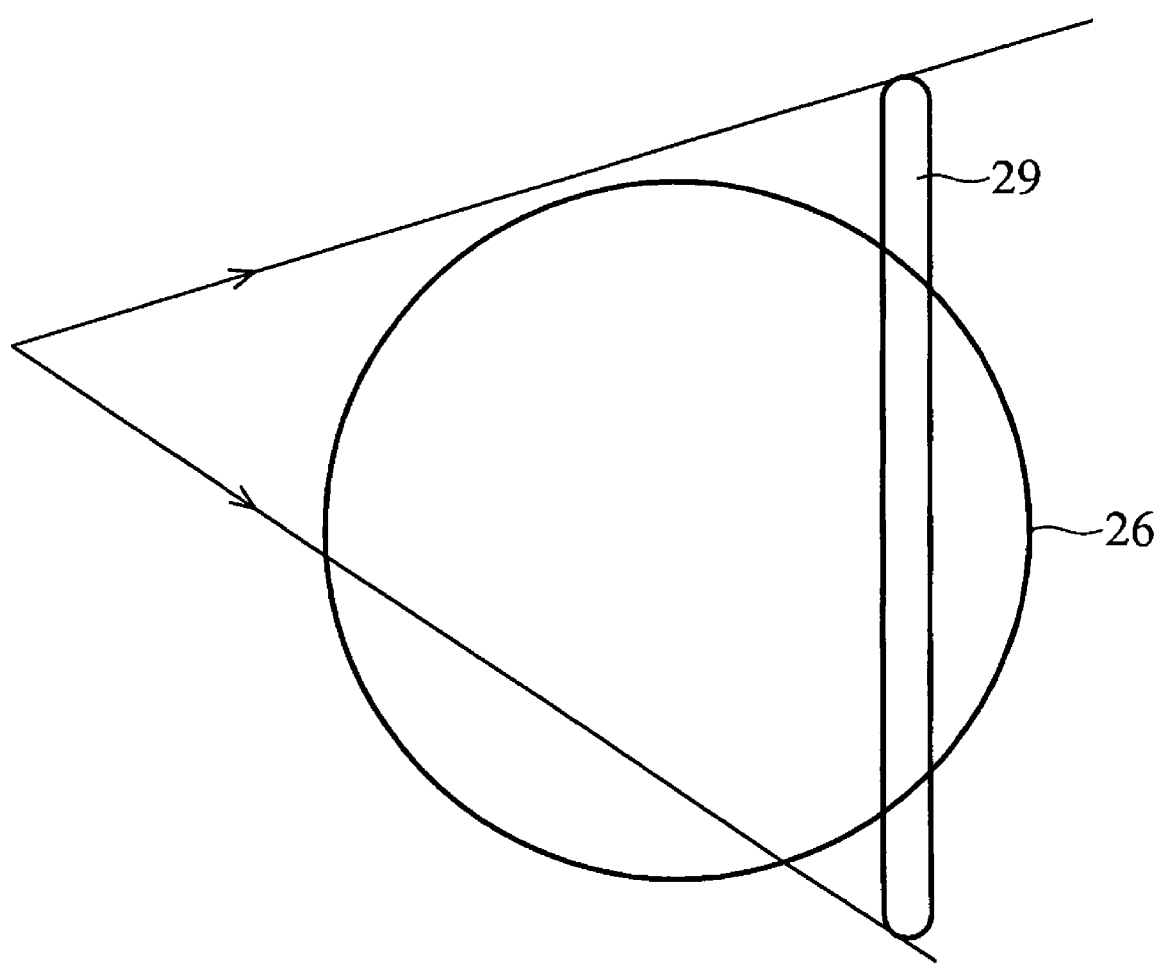

FIG. 7 illustrates another embodiment, wherein wafer 26 is scanned using the energy source. During the duration of one pulse, the energy source such as the UV light preferably scans the entire wafer 26. At any moment, UV light is applied on a line pulse area, which may be similar to line pulse area 29. Line pulse area 29 may be as large as being able to cover the entire wafer 26, or only cover a strip of wafer 26, or even as small as a spot. If the scanned area is less than the entire wafer 26, the energy source scans back and forth to cover the entire wafer. It is required to provide sufficient activation for the reaction to timely achieve uniform film with good properties. Since line pulse area 29 is scanned in short pulse time, the temperature of the wafer 26 is not adversely increased. The embodiments shown in FIGS. 6 and 7 can be combined to achieve better results.

In previous exemplary embodiments, only ALD processes are discussed. It is appreciated that the invention can be used on other CVD methods, particularly low-temperature CVD methods, such as metal organic CVD (MOCVD). These methods typically use relatively low temperatures than other methods, and thus the respective thermal energy might not be enough for a complete reaction. The activation energy provided by the energy source may thus be used to make the reaction more thorough.

The preferred embodiments have several advantageous features. By activating precursors with an energy source, the free energy barrier for chemical reactions may be overcome, and thus the reactions become easier. Therefore, the incubation time is reduced and the reaction rate is increased. Less incubation time results in a more uniform film. Furthermore, with the additional energy provided by the energy source, the chemical reactions are more complete, resulting in denser films. For example, Si—Cl bonds may be broken by the additional energy, and thus in the resulting films, the chlorine impurity is reduced, and the films are denser. For very thin dielectric films, more uniform and denser films will result in lower leakage currents and higher breakdown voltages. In addition, the energy source used by the present invention will not cause damage to ultra-thin film like direct plasma energy source.

Although the present invention and its advantages have been described in details, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An atomic layer deposition (ALD) method, the method comprising:
   placing a semiconductor wafer into a reaction chamber;
   pulsing a reactant in a gaseous form into the reaction chamber;
   applying a light on the reactant in the reaction chamber and before the reactant reaches the semiconductor wafer, wherein the light is not applied on the semiconductor wafer;
   reacting the reactant to form a film on the semiconductor wafer;
   performing a purging step to the reaction chamber; and
   performing a plurality of repeated cycles, with each of the cycles comprising:
      a first cycle comprising:
         pulsing the reactant in the gaseous form into the reaction chamber; and
         reacting the reactant to increase a thickness of the film, wherein the light is applied during the step of pulsing the reactant in the first cycle; and
      a second cycle comprising:
         pulsing the reactant in the gaseous form into the reaction chamber; and
         reacting the reactant to increase the thickness of the film, wherein the light is not applied during the step of pulsing the reactant in the second cycle.

2. The ALD method of claim 1, wherein the step of applying the light is performed during the step of pulsing the reactant, and wherein the light is not applied during the step of purging.

3. The ALD method of claim 1, wherein the light is an ultra-violet (UV) light.

4. The ALD method of claim 1 further comprising:
   pulsing an additional reactant in a gaseous form into the reaction chamber; and
   performing an additional purging step to the reaction chamber, wherein the light is not applied to the additional reactant.

5. The ALD method of claim 1, wherein a region immediately over the semiconductor wafer is free from the light, and an additional region over the region is applied with the light.

6. The ALD method of claim 1, wherein the light is applied in a direction parallel to a surface of the semiconductor wafer, and wherein the reactant is introduced in a direction non-parallel to the surface of the semiconductor wafer, with the light being applied to a portion of the reactant directly over the semiconductor wafer.

7. The ALD method of claim 1, wherein the reactant is introduced in a direction perpendicular to a surface of the semiconductor wafer, and wherein the light is applied to the reactant from below the semiconductor wafer, with the light being applied to a portion of the reactant directly over the semiconductor wafer.

* * * * *